United States Patent
Kamitani

(10) Patent No.: US 7,416,762 B2
(45) Date of Patent: *Aug. 26, 2008

(54) METHOD OF MANUFACTURING LITHOGRAPHIC PRINTING PLATE

(75) Inventor: Kiyoshi Kamitani, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/984,908

(22) Filed: Nov. 10, 2004

(65) Prior Publication Data

US 2005/0084803 A1    Apr. 21, 2005

Related U.S. Application Data

(63) Continuation of application No. 09/895,264, filed on Jul. 2, 2001, now Pat. No. 6,933,017.

(30) Foreign Application Priority Data

Jun. 30, 2000    (JP) .............................. 2000-198007

(51) Int. Cl.
*B05D 3/02*    (2006.01)

(52) U.S. Cl. .................. 427/379; 427/385.5; 427/407.1

(58) Field of Classification Search .................. 427/144, 427/372.2, 374.1, 377, 379, 384, 398.5, 407.1, 427/508, 521, 522, 553, 557, 591, 592, 595
See application file for complete search history.

(56) References Cited

U.S. PATENT DOCUMENTS

| 3,068,119 | A | * | 12/1962 | Gotsch ........................ 427/521 |
|---|---|---|---|---|
| 4,567,673 | A | | 2/1986 | Bohnensieker |
| 5,058,500 | A | | 10/1991 | Mizuno |
| 5,077,912 | A | * | 1/1992 | Ogawa et al. .................. 34/422 |
| 5,323,546 | A | | 6/1994 | Glover et al. |
| 5,380,612 | A | | 1/1995 | Kojima et al. |
| 5,675,913 | A | | 10/1997 | Matsuda et al. |
| 5,731,038 | A | | 3/1998 | Ogasawara |
| 5,881,476 | A | | 3/1999 | Strobush et al. |
| 5,906,862 | A | * | 5/1999 | Yapel et al. .................. 427/378 |
| 6,270,938 | B1 | * | 8/2001 | Gandini et al. .............. 430/157 |
| 6,461,795 | B1 | * | 10/2002 | McCullough et al. ....... 430/302 |
| 6,933,017 | B2 | * | 8/2005 | Kamitani .................... 427/379 |

FOREIGN PATENT DOCUMENTS

| JP | 2-227160 | 9/1990 |
|---|---|---|
| JP | 06-063487 | 3/1994 |
| JP | 6-24673 | 4/1994 |
| JP | 6-49175 | 6/1994 |
| JP | 06-317896 | 11/1994 |
| JP | 2001-117219 | 4/2001 |

* cited by examiner

*Primary Examiner*—William Phillip Fletcher, III
(74) *Attorney, Agent, or Firm*—Sughrue Mion, PLLC

(57) ABSTRACT

A method for manufacturing a lithographic printing plate is provided in which conditions for heating a support and a photosensitive coated layer in a drying and heating step can be changed rapidly over a wide range, and the photosensitive coated layer and the support are heated without being contacted.

22 Claims, 1 Drawing Sheet

METHOD OF MANUFACTURING LITHOGRAPHIC PRINTING PLATE

This is a continuation of application Ser. No. 09/895,264 filed Jul. 2, 2001 now U.S. Pat. No. 6,933,017. The entire disclosure of the prior application, application Ser. No. 09/895,264 is considered part of the disclosure of the accompanying continuation application and is hereby incorporated by reference.

BACKGROUND OF THE INVENTION

1. Field of the Invention

The present invention relates to a method of manufacturing a lithographic printing plate, and in particular, to a method of manufacturing a lithographic printing plate which is suited to the manufacturing of digital direct printing plates which are applied to direct plate-making systems.

2. Description of the Related Art

A so-called conventional printing plate is widely used as a conventional photosensitive lithographic printing plate. After this conventional printing plate is mask-exposed (planarly exposed) via a lith film, the non-image portions of the photosensitive layer are dissolved and removed, such that the printing plate carries a desired image.

In recent years, digitizing techniques for electronically processing image information by using computers have come into wider use, and new plate-making techniques corresponding to these digitizing techniques have come to be put into practice. Specifically, light having high directivity, such as laser light, is modulated in accordance with digitized image information. By scan-exposing an original plate of a lithographic printing plate by using this laser light, a computer-to-plate (CTP) technique can be realized in which a printing plate is manufactured directly without use of a lith film. The demand for so-called digital direct plates which are suitable for this CTP technique continues to increase.

It is known that the quality of such a digital direct printing plate (i.e., the stability of the sensitivity, the scratch resistance, the ability to withstand repeated printing, and the like) is more easily affected, than the quality of a conventional printing plate is, by the drying conditions or the heating hardening conditions (curing conditions) of the photosensitive coated layer formed on the support. In particular, it is known that quality is affected by the heating conditions (temperature and time) during curing in which the support and the photosensitive coated layer are heated in order to accelerate the hardening of the photosensitive coated layer after evaporating and drying have been carried out until the organic solvent of the photosensitive coated layer is contained in a predetermined amount. Specifically, for example, when a plurality of types of digital direct printing plates, which differ only in that the thicknesses of their respective supports (which are formed by aluminum plates or the like) differ, are manufactured, if these supports and photosensitive coated layers are heated under the same conditions, differences in quality of the supports of the digital direct printing plates, which differences in quality are of an extent that cause problems in practice, arise due to the differences in the heat capacities of the supports.

Further, in conventional lithographic printing plate manufacturing processes, the drying process and the curing process for the support and the photosensitive coated layer are not clearly separated. For example, as disclosed in Japanese Patent Application Publication (JP-B) No. 6-24673, while a support on which a photosensitive coated layer is formed is conveyed in one direction, drying and curing are carried out by a hot-air drying system drying device which blows out hot air into a heating furnace disposed along the conveying path of the support. However, in this hot-air drying system drying device, it is difficult to change the heating conditions within a short period of time. Accordingly, when the thickness or the width or the like of the support is changed, in order to change the heating conditions for the support and the photosensitive coated layer, in most cases, the conveying speed of the support, i.e., the speed of manufacturing the lithographic printing plate, must be changed, and it is difficult to stabilize the production speed of digital direct printing plates.

Further, it has recently become clear that, in order to make the quality (i.e., the stability of the sensitivity, the scratch resistance, the ability to withstand repeated printing, and the like) of digital direct printing plates sufficiently high and stable, there is the need to supply a great amount of heat to the photosensitive coated layer at the time of curing, as compared with conventional printing plates. (With regard to this point, refer to, for example, Japanese Patent Application No. 11-301240, the applicant of which is the same as the applicant of the present application.) Thus, when digital direct printing plates and conventional printing plates are to be manufactured by using the same equipment, the manufacturing speeds are controlled by the heating capacities with respect to the supports and the photosensitive coated layers, and the speed of manufacturing the digital direct printing plate must be decreased greatly as compared to that of the conventional printing plate.

As a means for overcoming the above-described insufficient heating capacity, JP-B No. 6-49175 discloses a method of supplying a large amount of heat to a support in a short time by heating rollers which contact the reverse surface of the support. Further, Japanese Patent Application Laid-Open (JP-A) No. 2-227160 discloses a method of controlling an amount of heat supplied to a support by changing the time over which heating rollers contact a support. However, when a support is heated by these methods, minute scratches are formed in the reverse surface of the support by the heating rollers due to the support expanding or contracting due to the temperature difference between the support and the heating rollers, or due to the linear speed of the heating rollers and the conveying speed of the support not being equal or the like. These minute scratches do not present problems in practice in conventional printing plates. However, with digital direct printing plates, there are cases in which the photosensitive coated layer is scratched and problems arise with respect to quality, at the time that the support is wound up in a coil form or at the time that plural printing plates are stacked.

Thus, there is the demand for a technique for manufacturing high quality digital direct printing plates stably and at a low cost, in which the conditions for the heating of the support and the photosensitive coated layer during a drying and heating process can be changed quickly within a wide range, and heating can be carried out without the support and the photosensitive coated layer being contacted, without greatly remodeling the equipment for manufacturing conventional printing plates.

SUMMARY OF THE INVENTION

In view of the aforementioned, an object of the present invention is to provide a method for manufacturing a lithographic printing plate in which the conditions for the heating of a support and a photosensitive coated layer during a drying and heating process can be changed quickly within a wide range, and heating can be carried out without the photosensitive coated layer and the support being contacted.

A first aspect of the method for manufacturing a lithographic printing plate of the present invention comprises: a drying and heating step wherein, while a strip-shaped support, on which a photosensitive coating solution containing an organic solvent is coated such that a photosensitive coated layer is formed by the photosensitive coating solution, is continuously conveyed, the photosensitive coated layer is dried by a first heating means to a dry-to-touch state, and the support and the photosensitive coated layer are heated by a second heating means provided at a downstream side of the first heating means so that hardening of the photosensitive coated layer is promoted.

In accordance with the above-described method for manufacturing a lithographic printing plate, in the drying and heating step, while the strip-shaped support on which the photosensitive coated layer is formed is continuously conveyed, the photosensitive coated layer is dried by the first heating means to a dry-to-touch state, and the support and the photosensitive coated layer are heated by the second heating means so that hardening of the photosensitive coated layer is promoted. The support and the photosensitive coated layer are made to be sufficiently high temperatures by the first heating means, and the drying of the photosensitive coated layer sufficiently progresses, and the support and the photosensitive coated layer can be supplied to the second heating means. Thus, it suffices for the second heating means to supply, to the support and the photosensitive coated layer, only an amount of heat which is substantially equivalent to an amount of heat required for adjusting the temperature.

As a result, a heating device, which is a heat radiation system device or an induction heating system device or the like in which adjustment of the amount of supplied heat can be carried out in a short time, can be used as the second heating means. Thus, the conditions of heating the support and the photosensitive coated layer can be changed rapidly and over a wide range, and further, the support and the photosensitive coated layer can be heated without being contacted.

Here, the dry-to-touch state of the photosensitive coated layer means a state in which, even if the surface of the photosensitive coated layer is touched by a finger, the photosensitive coated layer does not adhere to the finger. The liquid viscosity of the photosensitive coated layer at this time is generally $10^8$ to $10^{10}$ poise or more. As a specific example of the heating conditions by the first heating means, while the photosensitive coated layer is heated by the first heating means to 90° C. or more and preferably 100° C. or more, the amount of organic solution remaining in the photosensitive coated layer is 5 wt % or less, and preferably 3 wt % or less, of the photosensitive coated layer which is substantially completely dried.

Although the heating system of the first heating means is not particularly limited, a hot air drying method is preferable from the standpoints of the explosion-proof property and equipment costs, because the photosensitive coated layer contains an organic solvent. In order to prevent non-uniform blowing, it is preferable that, in the initial stages of drying, slow drying is carried out in which the temperature and the air speed are suppressed, and towards the latter half, the temperature and the amount of air are gradually increased.

At the point in time that the photosensitive coated layer is supplied to the first heating means, the photosensitive coated layer contains a large amount of organic solvent. Thus, the device forming the first heating means necessitates an explosion-proof structure. However, at the point in time when the photosensitive coated layer is supplied to the second heating means, the amount of the organic solvent remaining in the photosensitive coated layer is 5 wt % or less. Thus, the device forming the second heating means does not require an explosion-proof structure. Accordingly, separating the first heating means and the second heating means structurally may be advantageous with regard to cost as well since the structure of the second heating means is not limited.

At the second heating means, the support and the photosensitive coated layer are heated with the main purpose being the heating and hardening (i.e., curing) of the photosensitive coated layer on the support. At this time, from the standpoint of the quality of the lithographic printing plate, it is important to carry out heating accurately to a target temperature which is suitable for the characteristics of the photosensitive coated layer, and to maintain this target temperature over a predetermined period of time. In the same way as the first heating means, the heating system of the second heating means is not particularly limited. However, from the standpoint of preventing scratches in the reverse surface of the support, a non-contact system, such as a hot air system, a heat radiation system, an induction heating system, or the like is more preferable than a contact heat transfer system such as heating rollers. From the standpoint of being able to change the heating condition in a short period of time, the heat radiation system and the induction heating system are more preferable than the hot air system. Further, using a hot air system in combination with a heat radiation system or an induction heating system is also effective in improving the heating efficiency.

A cooling zone, in which cooling is carried out by leaving the support and the photosensitive coated layer to cool, may be provided between the first heating means and the second heating means. However, from the standpoint of effectively using thermal energy, it is preferable that the time between the first heating means and the second heating means be made as short as possible, and that the cooling of the photosensitive coated layer and the support be suppressed.

Further, there is no need for the first heating means and the second heating means to each be a single heating device. Each of the first heating means and the second heating means can be structured by a plurality of drying devices disposed along the conveying path of the support.

The support is a plate-shaped object which is dimensionally stable, and examples thereof include paper, paper on which a plastic (such as polyethylene, polypropylene, polystyrene, or the like) is laminated, a metal plate (e.g., aluminum, zinc, copper, or the like), plastic film (e.g., cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate, polyvinyl acetal, and the like), a paper or plastic film on which a metal such as those mentioned above is laminated or deposited, or the like. The support of the present invention is preferably a polyester film or an aluminum plate, and thereamong, an aluminum plate, which has good dimensional stability and is relatively inexpensive, is particularly preferable. A preferable aluminum plate is a pure aluminum plate or an alloy plate whose main component is aluminum and which contains a trace quantity of a different element. A plastic film on which aluminum is laminated or deposited may be used. Examples of the different element contained in the aluminum alloy are silicon, iron, manganese, copper, magnesium, chromium, zinc, bismuth, nickel, titanium, and the like. The amount of the different element contained in the alloy is at most 10 wt %. In the present invention, the particularly preferable aluminum is pure aluminum. However, manufacture of completely pure aluminum in refining technologies is difficult. Thus, a slight amount of a different element may be contained. The thickness of the aluminum plate used in the present invention is about 0.1 mm to 0.6 mm, and preferably 0.15 mm to 0.4 mm, and particularly preferably 0.2 mm to 0.3 mm.

In a method for manufacturing a lithographic printing plate of a second aspect of the present invention, in the method for manufacturing a lithographic printing plate of the first aspect, a condition of heating by the second heating means is controlled in accordance with a type of the photosensitive coated layer formed on the support, such that a temperature of the photosensitive coated layer immediately after heating by the second heating means is a predetermined temperature which is set in accordance with the type of the photosensitive coated layer.

In accordance with the method for manufacturing a lithographic printing plate of the second aspect, a condition of heating by the second heating means is controlled in accordance with the type of the photosensitive coated layer formed on the support, such that the temperature of the photosensitive coated layer immediately after heating by the second heating means (i.e., the final temperature reached) is a predetermined temperature which is set in accordance with the type of the photosensitive coated layer. In this way, in the drying and heating step, the final temperature reached by the photosensitive coated layer of the digital direct printing plate can accurately be made to be the target temperature. Thus, differences in quality of lithographic printing plates, which result from differences in the final temperatures reached, can be made to be sufficiently small, and qualities (stability of sensitivity, scratch resistance, ability to withstand repeated printing, and the like) of digital direct printing plates can be stabilized.

Namely, the extent to which the temperature of the photosensitive coated layer immediately after heating by the second heating means (the final temperature reached) affects the quality of the lithographic printing plate greatly depends on the type of the photosensitive coated layer. For example, with a conventional printing plate, if the remaining amount of organic solvent can be kept to 5 wt % or less, the effects on quality due to differences in the final temperatures reached by photosensitive coated layers are small, and are not problematic. However, with regard to the thermal type digital direct printing plates disclosed in JP-A Nos. 7-285275 and 11-44956 and the photopolymer type digital direct printing plates disclosed in Japanese Patent Application Nos. 11-623298 and 11-301240, differences in the final temperatures reached by the photosensitive (heat-sensitive) coated layers result in great differences in quality, and it is necessary to precisely keep the final temperature reached within a target range.

Specifically, for a thermal type digital direct printing plate, the final reached temperature of the photosensitive coated layer must be 125 to 145° C., and preferably 130 to 140° C. For photopolymer type digital direct printing plates, the final temperature reached by the photosensitive coated layer must be 100 to 135° C., and preferably 105 to 130° C.

For processless printing plates and lithographic printing plates using a silver salt diffusion transfer method which are currently being researched and developed (see, for example, JP-A No. 5-289348), the final temperature reached by the photosensitive coated layer must be controlled to a narrow temperature range in the same way as, or even more so than, thermal type digital direct printing plates and photopolymer type digital direct printing plates. With these digital direct printing plates which are currently being researched and developed, the precision required of the final temperature reached by the photosensitive coated layer is within 10° C., and more preferably within 5° C. The present invention greatly contributes to an early realization of products of such printing plates which are currently being researched and developed.

In a method for manufacturing a lithographic printing plate of a third aspect of the present invention, in the method for manufacturing a lithographic printing plate of the first aspect or the second aspect, in a case in which thicknesses and widths of supports supplied to the second heating means continuously change, a condition of heating the supports and photosensitive coated layers by the second heating means changes in accordance with the thicknesses and the widths of the supports.

In accordance with the method for manufacturing a lithographic printing plate of the third aspect, in a case in which the thickness and the width of the support supplied to the second heating means change, a condition of heating the support and the photosensitive coated layer by the second heating means is changed in accordance with the thickness and the width of the support. In this way, because the condition of heating by the second heating means can be changed quickly in accordance with changes in the dimensions of the supports, even if the dimensions of the supports which are being conveyed continuously vary, the final temperatures reached by the photosensitive coated layers can be accurately made to be the target temperatures without varying the conveying speed of the supports.

Namely, in a case in which, in the drying and heating process, the support and the photosensitive coated layer are heated under a constant heating condition, when a one support, which has a different dimension (thickness or width) than another support conveyed continuously at the upstream side, is connected to the final end portion of the other support, the heat capacity per unit length of the support changes from the portion at which the supports are connected. Thus, a change in the final temperature reached by the photosensitive coated layer arises in accordance with this change in the dimensions of the support. Accordingly, in a case in which the dimensions of the supports change during the manufacturing of digital direct printing plates, the heating conditions for the photosensitive coated layer and the support must be changed rapidly in accordance with the change in the dimensions of the support.

However, in a method in which the photosensitive coated layer is dried by the photosensitive coated layer and the support being heated by a single hot air type drying device which is provided as the first heating means, it is difficult to change in a short period of time the amount of heat supplied, per unit time, to the photosensitive coated layer and the support. In most cases, when the dimensions of the support change, the manufacturing speed or the heating conditions of the lithographic printing plates are changed, and the amount of supplied heat is changed in accordance with the dimensions of the support or the type of photosensitive coated layer. As a result, as compared with conventional printing plates, produceability in manufacturing digital direct printing plates is unstable, and a problem arises in that the costs involved in manufacturing digital direct printing plates increase.

Here, for example, the above-described heat radiation system or electromagnetic induction heating system drying device is used as the second heating means. The target temperature at the exit of the drying and heating process is set in accordance with the type (product type) of the photosensitive coated layer. Thus, it is effective to use the second heating means together with hot air heating of a temperature which is slightly higher than the target temperature. In accordance with such a drying device, it is quite possible to change the heating condition within one minute at the latest. Further, if a plurality of such drying devices are provided as the second heating means along the conveying path of the support and the amounts of heat supplied by each of the plurality of drying devices are controlled in accordance with changes in the dimensions of the supports, the heating condition can be changed in an even shorter period of time.

In a method of manufacturing a lithographic printing plate of a fourth aspect of the present invention, in the method of manufacturing a lithographic printing plate of any of the first second or third aspects, after hot air drying of the coated layer by the first heating means, the second heating means radiates mid-infrared radiation or far infrared radiation to the photosensitive coated layer and the support so as to heat the support and the photosensitive coated layer.

In accordance with the method of manufacturing a lithographic printing plate of the fourth aspect, after hot air drying of the coated layer by the first heating means, the second heating means radiates mid-infrared radiation or far infrared radiation to the photosensitive coated layer and the support so as to heat the support and the photosensitive coated layer. In this way, the photosensitive coated layer can be efficiently heated and dried without there being fogging of the photosensitive coated layer.

It has been conventionally thought that, in a lithographic printing plate production line, drying and curing of a photosensitive coated layer by an infrared radiation system drying device was difficult due to concerns relating to ignition of and generation of fogging in the photosensitive coated layer which contains an organic solvent. Namely, when an infrared radiation system drying device was used, there was the fear that the organic solvent would ignite if the surface temperature was set high, and that, if the surface temperature was lowered to the ignition point or lower, the drying efficiency would be markedly inferior to that of a hot air system. Further, electrical circuits, for which there is the concern of generation of sparks, were set under high temperatures near the photosensitive coated layer. For these reasons, measures for preventing explosions in infrared radiation system drying devices were difficult as compared to hot air system drying devices.

Further, some photosensitive coated layers are reactive with respect to infrared radiation, and there is the fear that fogging may occur in photosensitive coated layers due to infrared radiation. For this reason as well, it was thought that infrared radiation system drying devices were unsuitable for application to the processes of drying and heating lithographic printing plates. In particular, in thermal type digital direct printing plates, the exposure source is an infrared radiation laser (830 nm), and the photosensitive coated layer is heat-sensitive. Thus, there were many concerns relating to quality when using, as the heat source, an infrared radiation radiating device with a surface temperature (of 300° C. or more) which had a better heating efficiency than a hot air system.

While taking the above circumstances into consideration, the present inventors studied using an infrared radiation system drying device as a second heating means. As a result, the present inventors confirmed that a photosensitive coated layer has absorbing regions at a mid-infrared region (2 to 4 μm) and a far infrared region (4 to 1000 μm), and that the heat generating efficiency thereof is good. Further, the present inventors confirmed that infrared radiation (a surface temperature of 800° C. or less), which does not contain wavelengths in the near infrared region of 1 μm or less, does not effect the quality of the photosensitive coated layer nor the thermal type digital direct printing plate. Further, because the photosensitive coated layer is dried by the first heating means to a dry-to-touch state, at the time of heating by the second heating means, there is no fear that the photosensitive coated layer and the vaporized components from the photosensitive coated layer will ignite, and there is no need to take measures to make the device forming the second heating means explosion-proof.

By using an infrared radiation system drying device as the second heating means, as compared to a hot air system drying device, the heating condition can be changed quickly, less space is required for the device, and the equipment costs can be kept down. The method for changing the heating conditions at this time may be the changing of the surface temperature of an infrared radiation radiating device, the changing of the radiating surface area of an infrared radiation radiating device, the changing of the distance between the support and an infrared radiation radiating device, or the like, but is not limited to these methods.

In a method of manufacturing a lithographic printing plate of a fifth aspect of the present invention, the method of manufacturing a lithographic printing plate of any of the first second, third or fourth aspects further comprises a cooling step in which the support and the photosensitive coated layer are forcibly cooled by a cooling means provided at a downstream side of the second heating means.

In accordance with the method of manufacturing a lithographic printing plate of the fifth aspect, the support and the photosensitive coated layer are forcibly cooled by a cooling means provided at a downstream side of the second heating means. In this way, as compared with a case in which the photosensitive coated layer is left to cool naturally, the surface temperature of the photosensitive coated layer can be decreased in a short time. Thus, there are fewer restrictions on the layout of conveying members such as conveying rollers and the like, and the time until an overcoat layer can be coated on the photosensitive coated layer can be shortened.

Namely, immediately after heating by the second heating means, the surface temperature of the photosensitive coated layer is generally 100° C. or more. When a member such as a conveying roller or the like contacts the surface of the photosensitive coated layer which is in such a high temperature state, there is the concern that the photosensitive coated layer may be peeled off. Further, in a photopolymer type digital direct printing plate, an overcoat layer is coated and formed as a layer on the photosensitive coated layer in order to cut-off oxygen. However, when the surface temperature of the photosensitive coated layer is high, there is the concern that there may be non-uniform coating of the overcoat layer.

Such problems can be overcome by lowering the temperature of the photosensitive coated layer by a cooling step to 50° C. or less, and preferably to 40° C. or less. Here, the method for forcibly cooling the photosensitive coated layer and the support may be any of various types of cooling methods other than naturally cooling the photosensitive coated layer and the support which are being conveyed, for example, an air-cooling system in which low temperature air is blown out onto the photosensitive coated layer, or a cooling roller system in which a low temperature cooling roller is made to contact the reverse surface of the support or the like. However, with a contact-type cooling method such as a cooling roller system or the like, in the same way as with a heating roller system, there is the fear that scratches may be formed in the support, and thus, a non-contact type cooling method such as an air-cooling system or the like is preferable.

DETAILED DESCRIPTION OF THE PREFERRED EMBODIMENTS

Figure 1:
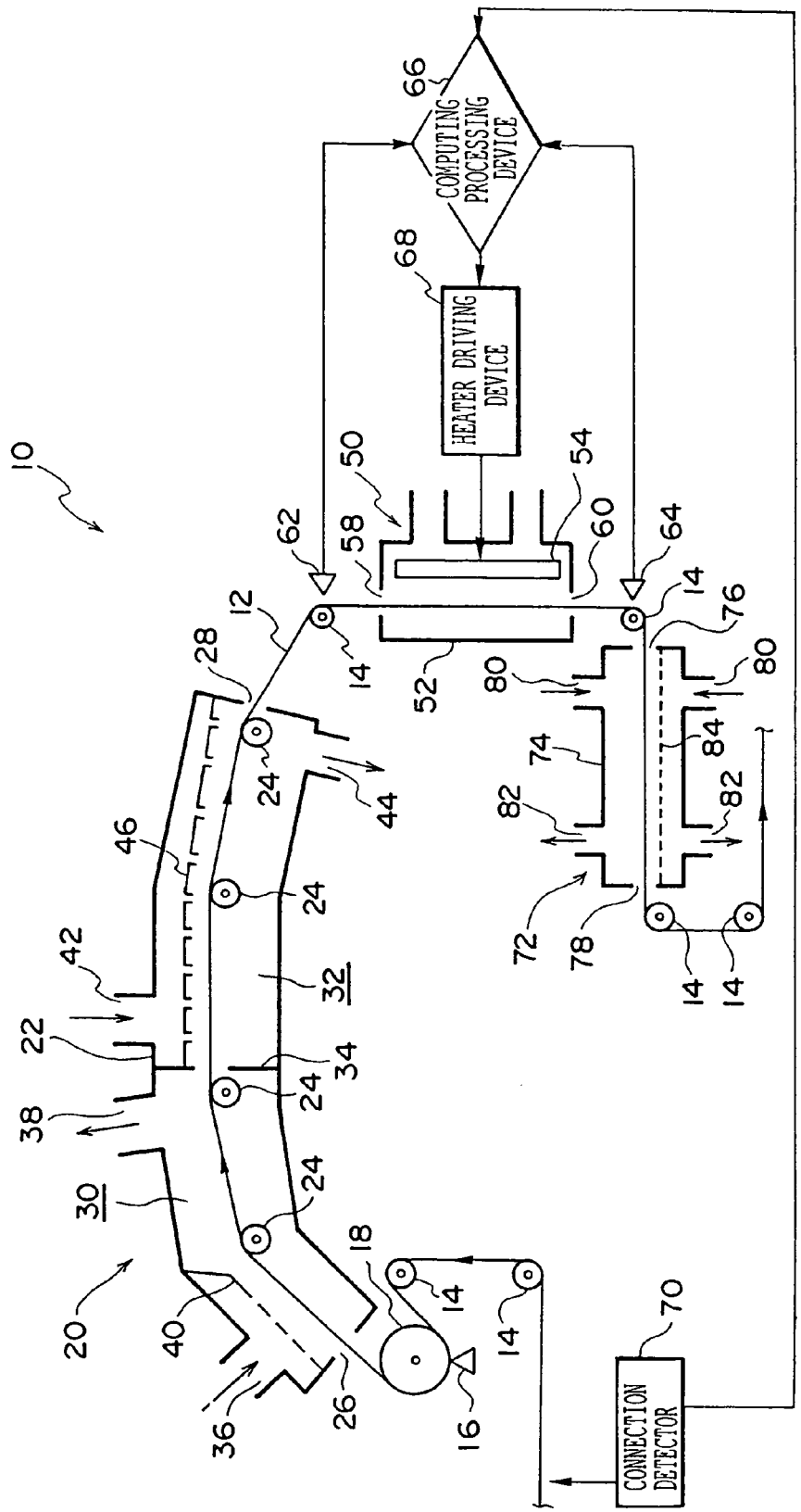
FIG. 1 is a structural view which schematically illustrates a lithographic printing plate production line relating to an embodiment of the present invention.

Hereinafter, a method of manufacturing a lithographic printing plate relating to an embodiment of the present invention will be described with reference to the drawing.

FIG. 1 illustrates a lithographic printing plate production line relating to an embodiment of the present invention. A device (not shown) for feeding out aluminum plates 12 serving as supports is provided at furthest upstream side of a production line 10. This feed-out device feeds-out the aluminum plates 12, which are of a thickness of from 0.1 to 0.6 mm, to the downstream side at a conveying speed corresponding to the speed of manufacturing the lithographic printing plates at the production line 10. A plurality of conveying rollers 14 are provided along the conveying path of the aluminum plates 12 at the production line 10. While the aluminum plate 12 is guided by the plural conveying rollers 14, the aluminum plate 12 receives conveying force from a conveying motor (not shown) via the conveying rollers 14, and is conveyed downstream at a predetermined speed.

At the production line 10, first, the configuration of the aluminum plate 12, which is fed-out toward the downstream side from the feed-out device, is corrected and the requisite planarity of the aluminum plate 12 is obtained by a correcting device (not shown) such as a roller leveler, a tension leveler or the like for improving planarity. Next, before surface roughening of the aluminum plate 12, if desired, a degreasing processing is carried out by, for example, a surfactant, an organic solvent, or an alkaline aqueous solution for removing the rolling oil from the surface of the aluminum plate 12. The roughening of the surface of the aluminum plate can be carried out by any of various methods, and is carried out, for example, by method of mechanically roughening the surface, a method of dissolving and roughening the surface electrochemically, or a method of selectively dissolving the surface chemically.

Any of known methods such as a ball polishing method, a brush polishing method, a blast polishing method, a buff polishing method, or the like, can be used as the mechanical method. Further, an example of the method of roughening the surface electrochemically is a method carried out by alternating current or direct current in a hydrochloric acid or nitric acid electrolytic solution. Moreover, a combination of both types of methods can be used as disclosed in JP-A No. 54-63902. The aluminum plate 12, whose surface has been roughened in this way, is subjected if necessary to an alkali etching processing or a neutralizing processing, and thereafter, if desired, is subjected to an anodizing treatment in order to improve the water retaining property of the surface and the wear resistance. Any of various electrolytes which form a porous acidic film can be used as the electrolytes used in the anodizing treatment of the aluminum plate 12, and generally, sulfuric acid, phosphoric acid, oxalic acid, chromic acid, or a mixed acid thereof is used. The concentration of the electrolyte is selected appropriately in accordance with the type of electrolyte.

Because the conditions of the anodizing treatment vary in accordance with the electrolyte which is used, the conditions cannot be stipulated uniformly. However, generally, the following conditions are appropriate: an electrolyte concentration of a 1 to 80 wt % solution, a solution temperature of 5 to 70° C., a current density of 5 to 60 A/dm$^2$, a voltage of 1 to 100 V, and an electrolyzing time of 10 seconds to 5 minutes. If the amount of the anodized film is less than 1.0 g/m$^2$, the ability to withstand repeated printing deteriorates, it is easy for the non-image portions of the lithographic printing plate to be scratched, and it is easy for so-called "scratch dirtying" to occur in which ink adheres to the scratched portions at the time of printing. After the anodizing treatment has been carried out, if needed, the aluminum surface is subjected to a hydrophilizing treatment. Examples of hydrophilizing treatments which can be used in the present invention are the alkali metal silicate (e.g., sodium silicate aqueous solution) methods disclosed in U.S. Pat. Nos. 2,714,066, 3,181,461, 3,280, 734, and 3,902,734. In these methods, the support is processed by being immersed in a sodium silicate aqueous solution or electrolyzed. In addition, the method of carrying out processing in potassium fluorozirconate disclosed in JP-B No. 36-22063, or the methods of carrying out processing in polyvinylphosphonic acid disclosed in U.S. Pat. Nos. 3,276, 868, 4,153,461, and 4,689,272, or the like may be used.

Next, if needed, an undercoat layer is formed on the aluminum plate 12 before formation of the photosensitive coated layer. Any of various organic compounds can be used as the component of the undercoat layer, and can be selected from phosphonic acids having an amino group such as carboxymethyl cellulose, dextrin, gum arabic, 2-aminoethyl phosphonate, and the like; organic phosphonic acids which may have a substituent such as phenyl phosphonate, naphthyl phosphonate, alkyl phosphonate, glycerophosphonic acid, methylene diphosphonate, ethylene diphosphonate, and the like; organic phosphoric acids which may have a substituent such as phenyl phosphate, naphthyl phosphate, alkyl phosphate, glycerophosphoric acid, and the like; organic phosphinic acids which may have a substituent such as phenyl phosphinate, naphthyl phosphinate, alkyl phosphinate, glycerophosphinic acid, and the like; amino acids such as glycine, β-alanine, and the like; hydrochlorides of amines having a hydroxy group such as hydrochloride of triethanol amine, and the like; and the like. Or, a mixture of two or more of the above compounds may be used.

The organic undercoat layer may be formed by a method such as the following: a method in which a solution is coated on an aluminum plate and dried, the solution being formed by dissolving one or more of the above-listed organic compounds in water or an organic solvent such as methanol, ethanol, or methylethyl ketone or the like, or a mixed solution thereof; and a method in which an aluminum plate is immersed in a solution formed by dissolving one or more of the above-listed organic compounds in water or an organic solvent such as methanol, ethanol, or methylethyl ketone or the like, or a mixed solution thereof, such that the organic compound(s) is (are) adsorbed, and thereafter, washing the aluminum plate with water or the like and drying the aluminum plate such that an organic undercoat layer is formed. In the former method, a solution having a concentration of the organic compound(s) of 0.05 to 10 wt % can be coated by any of various methods. In the latter method, the concentration of the solution is 0.01 to 20 wt % and preferably 0.05 to 5 wt %, and the immersion temperature is 20 to 90° C. and preferably 25 to 50° C., and the immersion time is 0.1 seconds to 20 minutes and preferably 2 seconds to 1 minute. The pH of the solution which is used can be adjusted by a basic substance such as ammonia, triethylamine, potassium hydroxide, or the like, or by an acidic substance such as hydrochloric acid, phosphoric acid, or the like. Further, a yellow dye for improving the tone reproduction of the image recording material can be added. The covering amount of the organic undercoat layer is appropriately 2 to 200 mg/m², and preferably 5 to 100 mg/m². If the covering amount is less than 2 mg/m², the ability to withstand repeated printings is insufficient. The same holds if the coated amount is greater than 200 mg/m².

As shown in FIG. 1, at the production line 10, a coating device 16 for coating a photosensitive coating solution onto the aluminum plate 12 is provided at the downstream side of the anodizing device. At the coating device 16, while the reverse surface side of the aluminum plate 12 is supported by a support roller 18, a photosensitive coating solution is applied to the surface of the aluminum plate 12 so as to form a photosensitive coated layer. The photosensitive coated layer is an organic solvent photosensitive coated layer which is photosensitive or heat-sensitive.

Namely, the photosensitive coated layer is a photosensitive coated layer in a conventional positive printing plate having a photosensitive coated layer whose main components are naphthoquinone diazide and phenol resin; a conventional negative printing plate having a photosensitive coated layer whose main components are a diazonium salt and an alkali resin or a urethane resin; a photopolymer digital direct printing plate having a photosensitive coated layer formed from an ethylene unsaturated compound/a photopolymerizable initiator/a binder resin; a thermal positive digital direct printing plate having a photosensitive coated layer whose main components are phenol resin/acrylic resin/an IR dye; and a thermal negative digital direct printing plate having a photosensitive coated layer formed from a thermal acid generator/a thermal crosslinking agent/a reactive polymer/and an IR dye. Further, the photosensitive coated layer may be an organic solvent type photosensitive coated layer of a thermal abrasion type processless printing plate, a heat-fusible processless printing plate, or a lithographic printing plate using a silver salt diffusion transfer method.

Examples of the organic solvent are ethylene chloride, cyclohexanone, methylethyl ketone, methanol, ethanol, propanol, ethyleneglycol monomethylether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethyl urea, N-methylpyrrolidone, dimethylsulfoxide, sulfolane, γ-butyrolactone, toluene, and the like. However, the organic solvent is not limited to these examples. A single one of these solvents or a mixture of these solvents may be used. The concentration of the aforementioned components (the total solids including additives) in the solvent is preferably 1 to 50 wt %. Further, the coated amount (solids) on the support obtained after coating and drying varies in accordance with the application, but generally, for a photosensitive printing plate, a coated amount of 0.5 to 5.0 g/m² is preferable.

Any of various known methods can be used as the method for applying the photosensitive coating solution onto the aluminum plate 12, and examples include bar coater coating, rotary coating, spray coating, curtain coating, dip coating, air knife coating, blade coating, roll coating, and the like. The smaller the coated amount, the greater the apparent sensitivity, but the worse the film characteristics of the photosensitive film. A surfactant for improving the coatability, e.g., the fluorine based surfactants disclosed in JP-A No. 62-170950, can be added to the photosensitive layer of the present invention. The preferable added amount is 0.01 to 1 wt % and more preferably 0.05 to 0.5 wt % of the total printing plate material.

As shown in FIG. 1, at the production line 10, a hot air drying device 20 serving as a first heating means is disposed downstream of the coating device 16. The hot air drying device 20 has a drying furnace 22 having an explosion-proof and thermally insulated structure and formed in a box-shape which is elongated along the conveying direction of the aluminum plate 12. A plurality of support rollers 24 are disposed in the drying furnace 22 along the conveying path of the aluminum plate 12.

Openings 26, 28 are formed in the upstream side end surface and the downstream side end surface, respectively, along the conveying direction of the aluminum plate 12 in the drying furnace 22. These openings 26, 28 are the entrance and exit of the aluminum plate 12 into and from the drying furnace 22. The aluminum plate 12 which is supplied into the drying furnace 22 from the opening 26 is conveyed in the drying furnace 22 while the reverse surface side thereof is supported by the support rollers 24, and is withdrawn to the exterior of the drying furnace 22 from the opening 28. A partitioning wall 34, which divides the drying furnace 22 into an upstream side heating chamber 30 and a downstream side heating chamber 32, is provided in the heating furnace 22. Movement of air between the heating chambers 30, 32 is suppressed by the partitioning wall 34.

An air inlet 36 and an air outlet 38 are provided at the upstream side heating chamber 30. A hot air generating device (not shown) is connected to the air inlet 36 via a duct or the like. Further, an airflow regulating plate 40 is provided within the heating chamber 30 so as to face the air inlet 36. A plurality of slit-shaped blow-out holes are formed in the airflow regulating plate 40. The airflow regulating plate 40 regulates the flow of the high temperature air (hot air) such that the high temperature air supplied into the heating chamber 30 from the air inlet 36 flows along the surface of the aluminum plate 12.

At this time, a high temperature gas of 50 to 100 m³/min per 1 m width of the aluminum plate 12 is supplied to the air inlet 36, and the temperature of this high temperature gas is controlled to 50 to 80° C. In this way, about 80% of the organic solvent contained in the photosensitive coated layer at the time of coating onto the surface of the aluminum plate 12 is evaporated in the heating chamber 30, and the photosensitive coated layer can be changed into a film which is in a soft film state.

The downstream side heating chamber 32 as well is provided with an air inlet 42 and an air outlet 44, and a hot air generating device (not shown) is connected to the air inlet 42 via a duct or the like. An airflow regulating plate 46 is provided in the heating chamber 32 between the air inlet 42 and the aluminum plate 12. A plurality of slit-shaped blow-out openings are formed in the airflow regulating plate 46 so as to face the surface of the aluminum plate 12. The airflow regulating plate 46 regulates the flow of high temperature air (hot air) such that the high temperature air supplied into the heating chamber 32 from the air intake 42 is blown substantially perpendicularly onto the surface of the aluminum plate 12.

At this time, a high temperature gas of 50 to 100 m³/min per 1 m width of the aluminum plate 12 is supplied to the air inlet 42, and the temperature of this high temperature gas is controlled to 100 to 120° C. In this way, about 95% or more of the organic solvent contained in the photosensitive coated layer at the time of coating onto the surface of the aluminum plate 12 is evaporated in the heating chamber 32, and the photosensitive coated layer, which was in a soft film state, can be made to be dry-to-touch.

As shown in FIG. 1, at the production line 10, a far infrared radiation heating device 50 serving as a second heating means is disposed downstream of the hot air drying device 20. A heating furnace 52, which is formed in a box-shape which is elongated along the conveying direction of the aluminum plate 12, is provided at the far infrared radiation heating device 50. A far infrared radiation heater 54 is disposed within the heating furnace 52 so as to oppose the surface of the aluminum plate 12. Openings 58, 60 are formed in the upstream and downstream side end surfaces along the aluminum plate 12 conveying direction in the heating furnace 52. These openings 58, 60 are the entrance and exit of the aluminum plate 12 into and from the heating furnace 52.

At the point in time when the aluminum plate 12 is withdrawn from the hot air drying device 20, the remaining amount of the organic solvent in the photosensitive coated layer on the aluminum plate 12 is 5 wt % or less of the photosensitive coated layer in the dried state. At the point in time when the aluminum plate 12 is supplied into the heating furnace 52, the remaining amount of the organic solvent in the photosensitive coated layer is even lower. Thus, there is no fear of igniting occurring. As a result, it suffices to not make the heating furnace 52 an explosion-proof structure, and to make the heating furnace 52 a thermally-insulated structure in order to improve the efficiency of heating the aluminum plate 12 and the photosensitive coated layer.

At the production line 10, temperature sensors 62, 64 are disposed slightly upstream and slightly downstream, respectively, of the heating furnace 52 of the far infrared radiation heating device 50. These temperature sensors 62, 64 measure the temperature of the surface of the aluminum plate 12, and output detection signals corresponding to the results of measurement to a computing processing device 66. Either of a contact-type or non-contact-type temperature sensor can be used as the temperature sensors 62, 64. However, in a case in which a contact-type temperature sensor such as a thermistor is used, in order to prevent the photosensitive coated layer from being scratched, it is necessary to measure the temperature of the reverse surface of the aluminum plate 12, and to correct this measured value to estimate the temperature of the photosensitive coated layer. In contrast, use of a non-contact-type temperature sensor such as a radiation temperature sensor is advantageous from the standpoints of accuracy of measurement and reliability because the temperature of the surface of the photosensitive coated layer can be directly measured.

The computing processing device 66 controls the amount of heat radiated by the far infrared radiation heater 54 via a heater driving device 68. Further, in addition to the detection signals from the temperature sensors 62, 64, production information from a higher order computer (not shown) is inputted to the computing processing device 66. This production information includes the type of the photosensitive coated layer and information relating to the dimensions (the thickness and the width) of the aluminum plate 12. Further, as shown in FIG. 1, a connection detector 70 is provided at the upstream side of the photosensitive coating solution coating device 16. The connection detector 70 is for detecting a connection portion between the aluminum plate 12 which is being dried and heated and the aluminum plate 12 which is connected to the trailing end portion of that aluminum plate 12. At the connected portion between a pair of aluminum plates 12, usually, a notch portion which is notched from a side end toward the center is formed, and a connecting tape is adhered. Thus, if the notch portion or the connecting tape can be detected optically or mechanically, the connection portion between a pair of aluminum plates 12 can be detected. The detection signal from the connection detector 70 is also outputted to the computing processing device 66. The computing processing device 66 tracks the connection portions by using the position of detection by the connection detector 70 as a starting point.

Here, when the computing processing device 66 recognizes, on the basis of the production information, that the dimension of the aluminum plate 12 has changed, immediately before a connection portion between aluminum plates 12 reaches the far infrared radiation heating device 50 or simultaneously with a connection portion reaching the far infrared radiation heating device 50, the computing processing device 66 changes the amount of heat radiated from the far infrared radiation heater 54 in accordance with the difference in the dimensions between the aluminum plates 12. Specifically, the computing processing device 66 changes the amount of heat radiated from the far infrared radiation heater 54 in accordance with the difference in the heat capacities per unit length of the upstream and downstream aluminum plates 12. The width of variation in the amount of radiated heat at this time is a relatively small width corresponding to the difference in dimensions of the aluminum plates 12. Further, the amount of heat radiated from the far infrared radiation heater 54 can be changed quickly in accordance with the drive signal of the heater driving device 68. Thus, controlling the amount of heat radiated from the far infrared radiation heater 54 to the target heat amount is usually completed within one minute. Thereafter, on the basis of the detection signals from the temperature sensors 62, 64, the computing processing device 66 feedback-controls the amount of heat radiated from the far infrared radiation heater 54 such that the temperature of the surface of the photosensitive coated layer falls within a target temperature range set in accordance with the type of the photosensitive coated layer.

A far infrared radiation heater, whose far infrared radiation emitting body is a ceramic, is appropriate for use as the far infrared radiation heater 54 of the present embodiment. A gas type or electrical type far infrared radiation heater which allows the ceramic to become a sufficiently high temperature is suitable. The far infrared radiation heater 54 may be tube-shaped or panel-shaped. However, a panel shape is optimal from the standpoint of being able to independently set different conditions in the conveying direction and the widthwise direction of the aluminum plate 12 which serves as a support. The surface temperature of the ceramic of the far infrared radiation heater 54 at this time must be at least 300° C. ($\lambda$ max: 5.1 $\mu$m) at which the drying efficiency by the hot air system is excellent, and must be at most 800° C. ($\lambda$ max: 2.7 $\mu$m) at which no wavelengths of 1 $\mu$m or less are included.

In the above-described far infrared radiation heating device 50, drying is carried out until the amount of solvent remaining in the photosensitive coated layer on the aluminum plate 12 is 5% or less, and the photosensitive coated layer is made to be a sufficiently high temperature (100° C. or more). Thus, the photosensitive coated layer and the aluminum plate 12 are heated by the far infrared radiation heater 54 with the main object being the hardening of the photosensitive coated layer. The final temperature which the photosensitive coated layer reaches at this time is 130 to 140° C. at a thermal type digital direct printing plate, and is 105 to 130° C. at a photopolymer type digital direct printing plate.

At the production line 10, a forced cooling type cooling device 72 is disposed downstream of the far infrared radiation heating device 50. As shown in FIG. 1, the cooling device 72 is provided with a cooling tank 74 which is shaped as a box which is elongated along the conveying direction of the aluminum plate 12. Openings 76, 78 are formed at the upstream and downstream side end surfaces along the conveying direction of the aluminum plate 12 in the cooling tank 74. These openings 76, 78 are an entrance and an exit of the aluminum plate 12 into and from the cooling tank 74.

Two sets of an air inlet 80 and an air outlet 82 are provided at the cooling tank 74, so as to correspond to the surface and the reverse surface of the aluminum plate 12 respectively. A cold air generating device (not shown) is connected to both of the two air inlets 80 via ducts or the like. An airflow regulating plate 84 is disposed in the cooling tank 74 between the surface of the aluminum plate 12 and the air inlets 80. A plurality of slit-shaped blow-out openings are formed in the airflow regulating plate 84 so as to face the surface of the aluminum plate 12. The airflow regulating plate 84 makes the low temperature air supplied into the cooling tank 74 from the air inlet 80 into a low temperature airflow (cold air) which is blown substantially perpendicularly onto the surface of the aluminum plate 12. Further, the airflow regulating plate 84 makes the low temperature air supplied into the cooling tank 74 from the air inlet 80 facing the reverse surface side of the aluminum plate 12 an airflow which flows along the reverse surface of the aluminum plate 12. Accordingly, the aluminum plate 12 and the photosensitive coated layer which are being conveyed in the cooling tank 74 are forcibly cooled by a flow of low temperature air. At this time, the temperature and the amount of the low temperature air supplied into the cooling tank 74 are respectively set such that the photosensitive coated layer, which is heated by the far infrared radiation heating device 50 to 140° C. which is the maximum heated temperature, can be cooled to 40° C. or less.

At the production line 10, downstream of the cooling device 72, if needed, an overcoat layer can be formed on the photosensitive coated layer by applying PVA (polyvinyl alcohol) or the like for the purpose of cutting off oxygen or the like. At this time, because the temperature of the surface of the photosensitive coated layer on the aluminum plate 12 is 40° C. or less, no irregularities in coating are generated in the overcoat layer, and the overcoat layer can be hardened quickly.

The production of the web, which is the material of the digital direct printing plate and which is formed as described above, is completed. This web is wound-up in roll form by a web take-up device (not shown), so as to form a web roll. This web roll is supplied to a digital direct printing plate processing line. The web roll is subjected to processings such as an interleaf sheet for protection being adhered thereto, the web roll being cut into product sizes, and the like, such that digital direct printing plates which are products are manufactured.

EXAMPLES

Example of Application to Thermal Positive Type Digital Direct Printing Plate

A support and a photosensitive coated layer, which were materials for a thermal positive type digital direct printing plate, were manufactured experimentally in accordance with the following methods.

① Synthesis of Specific Copolymer $P_1$ 31.0 g (0.36 mol) of methacrylic acid, 39.1 g (0.36 mol) of ethyl chloroformate, and 200 ml of acetonitrile were placed in a 500 ml three-necked flask equipped with a stirrer, a cooling tube and a dropping funnel. While the flask was cooled in an ice water bath, the mixture was stirred. 36.4 g (0.36 mol) of triethylamine was added to this mixture by drops through the dropping funnel over about one hour. After this dropwise addition was completed, the ice water bath was removed, and the mixture was stirred for 30 minutes at room temperature.

To this reaction solution was added 51.7 g (0.30 mol) of p-aminobenzene sulfonamide, and the mixture was stirred for one hour while being heated to 70° C. in an oil bath. After the reaction was finished, the mixture was added to one liter of water while the water was being stirred. The obtained mixture was stirred for 30 minutes. This mixture was filtered and the precipitate removed. The precipitate was made into a slurry by adding 500 ml of water, and thereafter, the slurry was filtered. The obtained solid was dried to obtain a white solid of N-(p-aminosulfonylphenyl)methacrylamide (yield: 46.9 g).

Next, 4.61 g (0.0192 mol) of N-(p-aminosulfonylphenyl) methacrylamide, 2.94 g (0.0258 mol) of ethyl methacrylate, 0.80 g (0.015 mol) of acrylonitrile, and 20 g of N,N-dimethylacetoamide were placed in a 20 ml three-necked flask equipped with a stirrer, a cooling tube and a dropping funnel. The mixture was stirred while being heated to 65° C. in a hot water bath. To this mixture was added 0.15 g of "V-65" (manufactured by Wako Junyaku KK), and while the temperature was maintained at 65° C., the mixture was stirred for 2 hours under a nitrogen flow. To this reaction mixture, a mixture of 4.61 g of N-(p-aminosulfonylphenyl)methacrylamide, 2.94 g of ethyl methacrylate, 0.80 g of acrylonitrile, and 0.15 g of N,N-dimethylacetoamide and "V-65" was added dropwise by the dropping funnel over 2 hours. After the dropwise addition was completed, the obtained mixture was stirred for two hours at 65° C. After the reaction was completed, 40 g of methanol was added to the mixture, cooling was carried out, and the obtained mixture was added to two liters of water while the water was being stirred. After the mixture was stirred for 30 minutes, the precipitate was removed by filtration, and 15 g of a white solid was obtained by drying. The weight average molecular weight (polystyrene standard) of this specific copolymer $P_1$ as measured by gel permeation chromatography was 53,000.

② Preparation of Support

An aluminum plate (material: JIS1050) of a thickness of 0.15 to 0.4 mm was washed and degreased with trichloroethylene. Thereafter, the surface was roughened by using a nylon brush and a 400 mesh pumice—water suspension. The aluminum plate was then washed well with water. The plate was immersed for 9 seconds in a 25% sodium hydroxide aqueous solution of 45° C. so that etching was carried out, and was washed with water. Thereafter, the plate was immersed for 20 seconds in 20% nitric acid, and washed with water. The amount of etching of the roughened surface at this time was about 3 g/m². Next, a direct current anodized film of 3 g/m² was formed on the aluminum plate by a 7% sulfuric acid electrolytic solution with a current density of 15 A/dm². Thereafter, the plate was washed with water and dried. Then, the following undercoat solution was applied thereto, and the coated film was dried for 1 minute at 90° C. The coated amount of the coated film after drying was 10 mg/m².

| Undercoat Solution | |
| --- | --- |
| β-Alanine | 0.5 g |
| Methanol | 95 g |
| Water | 5 g |

Further, the aluminum plate was processed for 10 seconds at 30° C. in a sodium silicate 2.5 wt % aqueous solution. The following undercoat solution was coated, and the coated film was dried for 15 seconds at 80° C. so as to obtain the support. At this time, the coated amount of the coated film after drying was 15 mg/m².

| Undercoat Solution | |
|---|---|
| Compound of Chemical Formula 1 | 0.3 g |
| Methanol | 100 g |
| Water | 1 g |

Chemical Formula 1

—(CH$_2$—CH)$_{85}$—
  |
  [phenyl]
  |
  COOH

—(CH$_2$—CH)$_{15}$—
  |
  [phenyl]
  |
  CH$_2$N$^+$Et$_3$  Cl$^-$ molecular weight 28,000

③ Formation of Photosensitive Coated Layer

A photosensitive coating solution having the following composition was coated, such that the coated amount after drying was 1.8 g/m$^2$, on the support obtained as described above, so as to form a photosensitive coated layer

| | |
|---|---|
| Specific copolymer P$_1$ | 0.75 g |
| m,p-Cresol novalak (m,p ratio = 6/4; weight average molecular weight: 3500; content of unreacted cresol: 0.5 wt %) | 0.25 g |
| p-Toluenesulfonic acid | 0.003 g |
| Tetrahydrophthalic anhydride | 0.03 g |
| Cyanine dye of Chemical Formula 2 | 0.017 g |
| Dye in which the counter ion of Victoria Pure Blue BOH was replaced with a 1-naphthalenesulfonic acid anion | 0.015 g |
| MEGAFAC F-177 (fluorine based surfactant manufactured by Dainippon Ink & Chemicals, Inc.) | 0.05 g |
| γ-Butylactone | 10 g |
| Methylethyl ketone | 10 g |
| 1-Methoxy-2-propanol | 1 g |

Chemical Formula 2

Cyanine dye A

[Structural formula of cyanine dye A with two naphthoindoline units linked via a conjugated chain through a cyclohexene ring bearing a Cl substituent; counter ion is p-toluenesulfonate (—SO$_3^-$); N-methyl groups shown as CH$_3$]

Next, the support and the photosensitive coated layer, which were materials for a thermal positive type digital direct printing plate and which were manufactured in accordance with the above methods, were heated by the hot air drying device 20 or the far infrared radiation heating device 50 of the production line 10 illustrated in FIG. 1, so as to prepare a sample of the digital direct printing plate. At this time, the thickness of the support (the aluminum plate) or the heating conditions were changed in steps, and the qualities (the ability to withstand repeated printing, the developability, and the overall quality) were evaluated for each of the samples having the different support thicknesses or heating conditions. The results are shown in Table 1.

TABLE 1

| conveying speed (m/min) | thickness of support (mm) | hot air drying device | | | far infrared radiation heating device | | | ability to withstand repeated printings | developability | overall quality |
|---|---|---|---|---|---|---|---|---|---|---|
| | | set temperature (° C.) | heating time (sec) | exit surface temperature (° C.) | set temperature (° C.) | heating time (sec) | exit surface temperature (° C.) | | | |
| 10 | 0.15 | 150 | 60 | 145 | — | — | — | ○ | X | X |
| | 0.30 | | | 141 | | | | ○ | Δ | Δ |
| | 0.40 | | | 130 | | | | ○ | ○ | ○ |
| 15 | 0.15 | | 45 | 141 | | | | ○ | Δ | Δ |
| | 0.30 | | | 133 | | | | ○ | ○ | ○ |
| | 0.40 | | | 121 | | | | Δ | ○ | Δ |
| 20 | 0.15 | | 30 | 132 | | | | ○ | ○ | ○ |
| | 0.30 | | | 123 | | | | Δ | ○ | Δ |
| | 0.40 | | | 109 | | | | X | ○ | X |
| 25 | 0.15 | | 24 | 122 | | | | Δ | ○ | Δ |
| | 0.30 | | | 115 | | | | X | ○ | X |
| | 0.40 | | | 103 | | | | X | ○ | X |
| | 0.15 | | | 117 | 400 | 5 | 137 | ○ | ○ | ○ |
| | 0.30 | | | 109 | | | 123 | Δ | ○ | Δ |
| | 0.40 | | | 96 | | | 108 | X | ○ | X |
| | 0.15 | | | 118 | 500 | | 144 | ○ | Δ | Δ |
| | 0.30 | | | 109 | | | 129 | ○ | ○ | ○ |
| | 0.40 | | | 95 | | | 114 | Δ | ○ | Δ |
| | 0.15 | | | 116 | 600 | | 153 | ○ | X | X |
| | 0.30 | | | 110 | | | 142 | ○ | Δ | Δ |
| | 0.40 | | | 96 | | | 126 | ○ | ○ | ○ |

Note that the X, Δ, and ○ symbols used for the evaluation of quality in Table 1 are defined as follows.
X . . . did not measure up to quality stipulated by quality standards (unsatisfactory quality)
Δ . . . although no problems in terms of quality standards, slight faults with respect to quality occurred
○ . . . no faults with respect to quality As is clear from the evaluations relating to developability in Table 1, when the final temperature reached in either the hot air drying device 20 or the far infrared radiation heating device 50 was 140° C. or more, the developability deteriorated. When this temperature exceeded 145° C., the developing was poor. Further, when the final temperature reached at either of the hot air drying device 20 or the far infrared radiation heating device 50 was 125° C. or less, the ability to withstand repeated printings deteriorated, and when this temperature was 120° C. or less, problems arose with respect to quality.

In a case in which the support (aluminum plate) and the photosensitive coated layer were heated by using only the hot air drying device 20 and with the heating condition being constant (set temperature=150° C.), a sample of an equivalent quality could not be produced if the conveying speed was not adjusted in accordance with the thickness of the support. Conversely, in a case in which an attempt was made to address the problems with respect to quality by making the conveying speed of the support constant and changing the heating condition by the hot air drying device 20, it was necessary to make the conveying speeds of other supports match the conveying speed of the support requiring the largest amount of heat (i.e., the conveying speed of the thickest support), and thus, the produceability deteriorated.

On the other hand, in a case in which both the hot air drying device 20 and the far infrared radiation heating device 50 were used, as compared with a case in which only the hot air drying device 20 was used, the conveying speed of the support could be made to be 1.25 to 2.5 times faster, and production at a line speed which was equivalent to that for conventional printing plates was possible. Further, by setting the heating conditions of the far infrared radiation heating device 50 in accordance with a support thickness of 0.15 to 0.40 mm, the conveying speed of the support could be maintained sufficiently fast (25 m/min), and stable production of thermal type digital direct printing plates which had no faults with respect to quality was possible.

Example of Application to Photopolymer Type Digital Direct Printing Plate

A support and a photosensitive coated layer, which were materials for a photopolymer type digital direct printing plate, were manufactured experimentally in accordance with the following methods.

① Synthesis of Polyurethane Resin

In a 500 ml three-necked, round-bottomed flask equipped with a condenser and a stirrer, 12.1 g (0.09 mol) of 2,2-bis (hydroxymethyl)propionic acid and 20.0 g (0.01 mol) of a diol compound (hydroxyl value: 56.9 mgKOH/g) were dissolved in 100 ml of N,N-dimethylacetyacedo. To this mixture was added 20.0 g (0.08 mol) of 4,4'-diphenylmethane diisocyanate and 3.4 g (0.02 mol) of hexamethylenediisocyanate, and the resultant mixture was heated and stirred for 5 hours at 100° C. Thereafter, the mixture was diluted with 200 ml of N,N-dimethylformamide and 400 ml of methyl alcohol. The reaction solution was added to four liters of water while stirring was carried out, and a white polymer was precipitated. This polymer $P_2$ was filtered out, was washed with water, and thereafter, was dried in a vacuum so as to obtain 45 g of the polymer $P_2$. The weight average molecular weight (polystyrene standard) as measured by gel permeation chromatography (GPC) was 50,000. Further, the amount of contained carboxyl groups (acid value) as measured by titration was 1.40 meq/g.

② Preparation of Support

The surface of an aluminum plate of a thickness of 0.15 to 0.4 mm was roughened by using a nylon brush and a 400 mesh pumice stone water suspension. The aluminum plate was then washed well with water. The plate was immersed for 60 seconds in a 10 wt % sodium hydroxide aqueous solution of 70° C. so that etching was carried out, and was washed with water. Thereafter, the plate was washed in 20% nitric acid so as to be neutralized, and then washed with water. The plate was subjected to an electrolytic surface roughening treatment at an anode time current amount of 160 coulomb/dm² in a 1 wt % nitric acid aqueous solution by using a sinusoidal alternating waveform current under the condition Va=12.7 V. The surface roughness was measured and found to be 0.6 μm (expressed as Ra). Then, the aluminum plate was immersed in a 30 wt % sulfuric acid aqueous solution and subjected to death mat processing for 2 minutes at 55° C. Thereafter, the aluminum plate was subjected to an anodizing treatment for 2 minutes in a 20 wt % sulfuric acid aqueous solution at a current density of 2 A/dm² such that the anodized film thickness was 2.7 g/m².

③ Method of Forming Photosensitive Coated Layer

A photosensitive coating solution (photopolymerizable photosensitive solution) having the following composition was coated, such that the coated amount after drying was 1.5 g/m², on the support obtained as described above, so as to form a photosensitive coated layer.

| | |
|---|---|
| Pentaerithritol tetraacrylate | 1.5 g |
| Polyurethane resin binder (polymer $P_2$) | 2.0 g |
| Sensitizing dye Dye-1 of (Chemical Formula 3) | 0.1 g |
| Photopolymerization initiator S-1 of Chemical Formula 3 | 0.2 g |
| Fluorine based nonionic surfactant | 0.03 g |
| Copper phthalocyanine pigment (organic polymer dispersed) | 0.1 g |
| Methylethyl ketone | 20.0 g |
| Propyleneglycol monomethyl ether | 20.0 g |

Chemical Formula 3

Sensitizing dye Dye-1

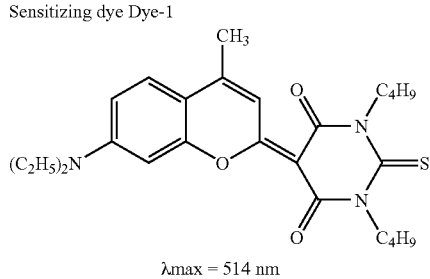

λmax = 514 nm

Photopolymerization initiator S-1

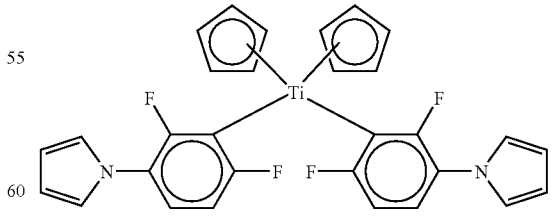

Next, the support and the photosensitive coated layer, which were materials for photopolymer type digital direct printing plate and which were manufactured in accordance with the above methods, were heated by the hot air drying device 20 or the far infrared radiation heating device 50 of the production line 10 illustrated in FIG. 1. Thereafter, the support and the photosensitive coated layer were cooled to 50° C. or less, and an aqueous solution of 3 wt % polyvinyl alcohol (degree of saponification: 86.5 to 89 mol %; degree of polymerization: 1000) was coated onto the photosensitive coated layer such that the dried coated weight thereof was 2.0 g/m$^2$. Drying was carried out for 90 seconds at 100° C. so as to form a sample. The qualities (the ability to withstand repeated printing, the developability, and the overall quality) were evaluated for each of the samples. The results are shown in Table 2.

On the other hand, in a case in which both the hot air drying device 20 and the far infrared radiation heating device 50 were used, as compared with a case in which only the hot air drying device 20 was used, the conveying speed of the support could be made to be 1.25 to 2.5 times faster, and production at a line speed which was equivalent to that for conventional printing plates was possible. Further, by setting the heating conditions of the far infrared radiation heating device 50 in accordance with a support thickness of 0.15 to 0.40 mm, stable production of photopolymer type digital direct printing plates which had no faults with respect to quality was pos-

TABLE 2

| | | hot air drying device | | | far infrared radiation heating device | | | ability to | | |
|---|---|---|---|---|---|---|---|---|---|---|
| conveying speed (m/min) | thickness of support (mm) | set temperature (° C.) | heating time (sec) | exit surface temperature (° C.) | set temperature (° C.) | heating time (sec) | exit surface temperature (° C.) | withstand repeated printings | developability | overall quality |
| 10 | 0.15 | 140 | 60 | 135 | — | — | — | ○ | X | X |
| | 0.30 | | | 131 | | | | ○ | Δ | Δ |
| | 0.40 | | | 119 | | | | ○ | ○ | ○ |
| 15 | 0.15 | | 45 | 131 | | | | ○ | Δ | Δ |
| | 0.30 | | | 123 | | | | ○ | ○ | ○ |
| | 0.40 | | | 110 | | | | Δ | ○ | Δ |
| 20 | 0.15 | | 30 | 122 | | | | ○ | ○ | ○ |
| | 0.30 | | | 108 | | | | Δ | ○ | Δ |
| | 0.40 | | | 99 | | | | X | ○ | X |
| 25 | 0.15 | | 24 | 109 | | | | Δ | ○ | Δ |
| | 0.30 | | | 102 | | | | X | ○ | X |
| | 0.40 | | | 93 | | | | X | ○ | X |
| | 0.15 | | | 107 | 300 | 5 | 122 | ○ | ○ | ○ |
| | 0.30 | | | 99 | | | 109 | Δ | ○ | Δ |
| | 0.40 | | | 86 | | | 95 | X | ○ | X |
| | 0.15 | | | 108 | 500 | | 132 | ○ | Δ | Δ |
| | 0.30 | | | 99 | | | 118 | ○ | ○ | ○ |
| | 0.40 | | | 85 | | | 108 | Δ | ○ | Δ |
| | 0.15 | | | 106 | 700 | | 152 | ○ | X | X |
| | 0.30 | | | 100 | | | 141 | ○ | X | X |
| | 0.40 | | | 86 | | | 123 | ○ | ○ | ○ |

Note that the X, Δ, and ○ symbols used for the evaluation of quality in Table 2 are defined as follows.
X . . . did not measure up to quality stipulated by quality standards (unsatisfactory quality)
Δ . . . although no problems in terms of quality standards, slight faults with respect to quality occurred
○ . . . no faults with respect to quality As is clear from the evaluations relating to developability in Table 2, when the final temperature reached in either the hot air drying device 20 or the far infrared radiation heating device 50 was 130° C. or more, the developability deteriorated. When this temperature exceeded 135° C., the developing was poor. Further, when the final temperature reached at either of the hot air drying device 20 or the far infrared radiation heating device 50 was 115° C. or less, the ability to withstand repeated printings deteriorated, and when this temperature was 110° C. or less, problems arose with respect to quality.

In a case in which the support and the photosensitive coated layer were heated by using only the hot air drying device 20 with the heating condition being constant (set temperature=140° C.), a sample of an equivalent quality could not be produced if the conveying speed was not adjusted in accordance with the thickness of the support. Conversely, in a case in which an attempt was made to address the problems with respect to quality by making the conveying speed of the support constant and changing the heating condition by the hot air drying device 20, it was necessary to make the conveying speeds of other supports match the conveying speed of the support requiring the largest amount of heat (i.e., the conveying speed of the thickest support), and thus, the produceability deteriorated.

sible, even with the conveying speed of the supports maintained sufficiently fast (25 m/min).

Specific Example of Manufacturing Schedule of Digital Direct Printing Plates

Next, a specific example of a manufacturing schedule of digital direct printing plates in accordance with a conventional method of manufacturing lithographic printing plates is shown in Table 3, and a specific example of a manufacturing schedule of digital direct printing plates in accordance with the method of manufacturing lithographic printing plates of the present invention is shown in Table 4.

TABLE 3

Conventional Manufacturing Method

| thickness of support (mm) | conveying speed (m/min) | pattern of changing of width of support | heating conditions |
|---|---|---|---|
| 0.15 | 20 | continuous change: large width → small width line stop dummy plate | hot air drying device (constant heating condition) |

TABLE 3-continued

Conventional Manufacturing Method

| thickness of support (mm) | conveying speed (m/min) | pattern of changing of width of support | heating conditions |
|---|---|---|---|
| 0.30 | 15 | continuous change: large width → small width | |
| | line stop | dummy plate | |
| 0.40 | 10 | continuous change: large width → small width | |

TABLE 4

Manufacturing Method in Accordance with the Present Invention

| thickness of support (mm) | conveying speed (m/min) | pattern of changing of width of support | heating conditions |
|---|---|---|---|
| able to change randomly in a range of 0.15 to 0.40 | constant: 25 m/min | continuous change: large width → small width | ① hot air drying device (constant heating condition) ② far infrared radiation heating device (automatically changes in accordance with thickness of support and the like) |

As is clear from Tables 3 and 4, with the conventional method of manufacturing lithographic printing plates, at the time that digital direct printing plates are manufactured, when the thickness of the support (aluminum plate) is changed, the production line must be temporarily stopped in order to ensure the quality of the digital direct printing plates. Further, when the support is thick, the conveying speed thereof must be reduced. However, in the method of manufacturing a lithographic printing plate of the present invention, even if the thickness of the support changes, there is no need to stop the production line, and there is no need to change the conveying speed of the support in accordance with the thickness of the support.

As is clear from the above description, in accordance with the method for manufacturing a lithographic printing plate of the present invention, the conditions for heating a support and a photosensitive coated layer in a drying and heating process can be change rapidly and in a wide range, and further, the photosensitive coated layer and the support can be heated without being contacted.

What is claimed is:

1. A method for manufacturing a lithographic printing plate, the method comprising:
   conveying a support, on which a photosensitive coating solution containing an organic solvent is coated such that a photosensitive coated layer is formed by the photosensitive coating solution;
   drying the photosensitive coated layer by a first heating means to a dry-to-touch state;
   heating the support and the photosensitive coated layer by a second heating means, which does not contact the support and the photosensitive coated layer, and which is provided at a downstream side of the first heating means, so that hardening of the photosensitive coated layer is promoted; and
   changing an amount of heat supplied by the second heating means while the support is being conveyed, wherein the amount of heat supplied by the second heating means is controlled in accordance with a thickness and a width of the support, such that a temperature of the photosensitive coated layer immediately after heating by the second heating means is a predetermined temperature which is set in accordance with the thickness and the width of the support.

2. A method for manufacturing a lithographic printing plate according to claim 1, wherein the first heating means heats the photosensitive coated layer to 90° C. or more.

3. A method for manufacturing a lithographic printing plate according to claim 1, wherein the first heating means dries the photosensitive coated layer such that a remaining amount of the organic solvent in the photosensitive coated layer is 5 wt % or less of the photosensitive coated layer.

4. A method for manufacturing a lithographic printing plate according to claim 1, wherein a heating system of the second heating means is a heat radiation system.

5. A method for manufacturing a lithographic printing plate according to claim 1, wherein a heating system of the second heating means is an induction heating system.

6. A method for manufacturing a lithographic printing plate according to claim 1, wherein the amount of heat supplied by the second heating means is controlled in accordance with a type of the photosensitive coated layer formed on the support, such that a temperature of the photosensitive coated layer immediately after heating by the second heating means is a predetermined temperature which is set in accordance with the type of the photosensitive coated layer.

7. A method for manufacturing a lithographic printing plate according to claim 6, wherein the method further comprising forcibly cooling the support and the photosensitive coated layer by a cooling means provided at a downstream side of the second heating means.

8. A method for manufacturing a lithographic printing place according to claim 7, wherein the cooling means is set so as to cool the photosensitive coated layer to a predetermined temperature or less.

9. A method for manufacturing a lithographic printing plate according to claim 6, wherein the lithographic printing plate is a digital direct printing plate.

10. A method for manufacturing a lithographic printing plate according to claim 1, wherein after hot air drying of the coated layer by the first heating means, the second heating means radiates mid-infrared radiation or far infrared radiation to the photosensitive coated layer and the support so as to heat the support and the photosensitive coated layer.

11. A method for manufacturing a lithographic printing plate according to claim 1, further comprising forming an overcoat layer on the photosensitive coated layer.

12. A method for manufacturing a lithographic printing plate according to claim 1, wherein the amount of the heat supplied by the second heating means is changed in accordance with the difference in heat capacity per unit length between upstream and downstream aluminum supports.

13. A method for manufacturing a lithographic printing place according to claim 1, wherein the method further comprising forcibly cooling the support and the photosensitive coated layer by a cooling means provided at a downstream side of the second heating means.

14. A method for manufacturing a lithographic printing plate according to claim 13, wherein the cooling means is set so as to cool the photosensitive coated layer to a predetermined temperature or less.

15. A method for manufacturing a lithographic printing plate according to claim 1, wherein the method further comprising forcibly cooling the support and the photosensitive coated layer by a cooling means provided at a downstream side of the second heating means.

16. A method for manufacturing a lithographic printing plate according to claim 15, wherein the cooling means is set so as to cool the photosensitive coated layer to a predetermined temperature or less.

17. A method for manufacturing a lithographic printing plate according to claim 1, wherein the amount of heat radiated from the second heating means is changed in accordance with a drive signal of a heater driving device.

18. A method for manufacturing a lithographic printing plate according to claim 1, wherein the lithographic printing plate is a digital direct printing plate.

19. A method for manufacturing a lithographic printing plate, the method comprising:
   conveying a support, on which a photosensitive coating solution containing an organic solvent is coated such that a photosensitive coated layer is formed by the photosensitive coating solution;
   drying the photosensitive coated layer by a first heating means to a dry-to-touch state;
   heating the support and the photosensitive coated layer by a second heating means, which does not contact the support and the photosensitive coated layer, and which is provided at a downstream side of the first heating means, so that hardening of the photosensitive coated layer is promoted; and
   changing an amount of heat from a heat source in the second heating means,
   wherein the amount of heat supplied by the second heating means is controlled in accordance with a thickness and a width of the support, such that a temperature of the photosensitive coated layer immediately after heating by the second heating means is a predetermined temperature which is set in accordance with the thickness and the width of the support.

20. A method for manufacturing a lithographic printing plate, the method comprising:
   conveying a support, on which a photosensitive coating solution containing an organic solvent is coated such that a photosensitive coated layer is formed by the photosensitive coating solution;
   drying the photosensitive coated layer by a first heating means to a dry-to-touch state;
   heating the support and the photosensitive coated layer by a second heating means, which does not contact the support and the photosensitive coated layer, and which is provided at a downstream side of the first heating means, so that hardening of the photosensitive coated layer is promoted; and
   changing a condition of the heating of the second heating means while the support is being conveyed,
   wherein the amount of heat supplied by the second heating means is controlled in accordance with a thickness and a width of the support, such that a temperature of the photosensitive coated layer immediately after heating by the second heating means is a predetermined temperature which is set in accordance with the thickness and the width of the support.

21. A method for manufacturing a lithographic printing plate, the method comprising:
   conveying a support, on which a photosensitive coating solution containing an organic solvent is coated such that a photosensitive coated layer is formed by the photosensitive coating solution;
   drying the photosensitive coated layer by a first heating means to a dry-to-touch state while the support is conveyed;
   heating the support and the photosensitive coated layer by a second heating means provided at a downstream side of the first heating means so that hardening of the photosensitive coated layer is promoted; and
   forcibly cooling the support and the photosensitive coated layer by a cooling means provided at a downstream side of the second heating means,
   wherein the cooling means cools the photosensitive coated layer having a surface temperature of no less than 100° C. to a temperature at which an overcoat layer can be uniformly coated, and the method further comprises forming the overcoat layer on the cooled photosensitive layer.

22. A method for manufacturing a lithographic printing plate according to claim 21, wherein the temperature at which the overcoat layer can be uniformly coated is 50° C. or less.

* * * * *